United States Patent
Breitwisch et al.

(10) Patent No.: US 8,116,126 B2
(45) Date of Patent: *Feb. 14, 2012

(54) MEASUREMENT METHOD FOR READING MULTI-LEVEL MEMORY CELL UTILIZING MEASUREMENT TIME DELAY AS THE CHARACTERISTIC PARAMETER FOR LEVEL DEFINITION

(75) Inventors: Matthew J. Breitwisch, Yorktown Heights, NY (US); Chung H. Lam, Yorktown Heights, NY (US); Bipin Rajendran, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 135 days.

This patent is subject to a terminal disclaimer.

(21) Appl. No.: 12/542,146

(22) Filed: Aug. 17, 2009

(65) Prior Publication Data

US 2011/0038199 A1    Feb. 17, 2011

(51) Int. Cl.
*G11C 11/00* (2006.01)
(52) U.S. Cl. .................... 365/163; 365/148; 365/189.07
(58) Field of Classification Search .................. 365/163, 365/148, 189.07
See application file for complete search history.

(56) References Cited

U.S. PATENT DOCUMENTS

| | | | |
|---|---|---|---|
| 6,597,183 B1 | 7/2003 | Male | |
| 6,690,183 B2 | 2/2004 | Braun | |
| 6,816,796 B2 | 11/2004 | Bierl | |
| 7,227,808 B2 | 6/2007 | Kim | |
| 7,505,334 B1 * | 3/2009 | Breitwisch et al. | 365/189.15 |
| 2002/0093855 A1 | 7/2002 | Heyne et al. | |
| 2009/0073783 A1 | 3/2009 | Breitwisch et al. | |
| 2009/0073784 A1 | 3/2009 | Breitwisch et al. | |
| 2010/0246247 A1 * | 9/2010 | Kim et al. | 365/163 |

* cited by examiner

*Primary Examiner* — Huan Hoang
(74) *Attorney, Agent, or Firm* — Cantor Colburn LLP; Vazken Alexanian

(57) ABSTRACT

A memory system includes a memory cell configured to represent at least two binary values, a bit line coupled to the memory cell, and first and second comparators coupled to the bit line that, respectively, compare a first and second reference value to a value of a parameter of the bit-line. The system also includes a first and second timers configured to measures a time for the parameter of the bit line to decay. The system also includes a logic unit coupled to the first and second timers that selects the time for the parameter of the bit line to decay from to a first value or a second value.

20 Claims, 5 Drawing Sheets

MEASUREMENT METHOD FOR READING MULTI-LEVEL MEMORY CELL UTILIZING MEASUREMENT TIME DELAY AS THE CHARACTERISTIC PARAMETER FOR LEVEL DEFINITION

BACKGROUND

The present invention relates to operation of memory storage systems, and more particularly, to reading multi-level memory cells that use time delay as a level characteristic.

Typical semiconductor computer memories are fabricated on semiconductor substrates consisting of arrays of large number of physical memory cells. In general, one bit of binary data is represented as a variation of a physical parameter associated with a memory cell. Commonly used physical parameters include threshold voltage variation of Metal Oxide Field Effect Transistor (MOSFET) due to the amount of charge stored in a floating gate or a trap layer in non-volatile Electrically Erasable Programmable Read Only Memory (EEPROM), or resistance variation of the phase change element in Phase-change Random Access Memory (PRAM).

Increasing the number of bits to be stored in a single physical semiconductor memory cell is an effective method to lower the manufacturing cost per bit. Multiple bits of data can also be stored in a single memory cell when variations of the physical parameter can be associated with multiple bit values. This multiple bits storage memory cell is commonly known as a Multi-Level Cell (MLC). Significant amount of effort in computer memory device and circuit designs is devoted to maximize the number of bits to be stored in a single physical memory cell. This is particularly true with storage class memory such as popular non-volatile Flash memories commonly used as mass storage devices.

The basic requirement for multiple bit storage in a semiconductor memory cell is to have the spectrum of the physical parameter variation to accommodate multiple non-overlapping bands of values. The number of bands required for an n-bit cell is $2^n$. A 2-bit cell needs 4 bands, a 3-bit cell needs 8 bands and so forth. Thus, the available spectrum of a physical parameter in a semiconductor memory cell is typically the limiting factor for multiple bit memory storage.

In addition to the limiting spectrum width, the ability for a memory controller or memory device to program or read a characteristic parameter in a memory cell diminishes as the number of levels in a memory cell increases. Factors such as electrical noise, sense voltage disturbance, and spectrum width all interfere with the accuracy of a characteristic parameter value read from a memory cell. It is desirable to devise a method to program and read a characteristic parameter to many distinct levels, while minimizing the perturbation to the parameter during read/write processes involving the memory cells.

SUMMARY

One embodiment of the present invention is directed to a memory system that includes a memory cell configured to represent at least two binary values and a a bit line coupled to the memory cell. The memory system also includes a first comparator coupled to the bit line that compares a first reference value to a value of a parameter of the bit-line and a second comparator coupled to the bit line that compares a second reference value to the value of a parameter of the bit-line. The system also includes a first timer coupled to the first comparator that measures a time for the parameter of the bit line to decay from a first value to the first reference value, a second timer coupled to the second comparator that measures a time for the parameter of the bit line to decay from a first value to the second reference value, and a logic unit coupled to the first timer and the second timer that selects the time for the parameter of the bit line to decay from a first value to the first reference value in the event it is greater than a minimum time and otherwise selects the time for the parameter of the bit line to decay from a first value to the second reference value.

Another embodiment of the present invention is directed to method for reading a memory cell in which a variation of the characteristic parameter of the memory cell affects the effective resistance of the memory cell. The method of this embodiment includes: measuring a first discharge time of a reference voltage through the memory cell; measuring a second discharge time of the reference voltage through the memory cell, wherein the first discharge time is measured during at least a portion of the time the second discharge time is being measured; determining that the first discharge time is less than a minimum discharge time; and determining the value stored in the memory cell based on the second discharge time. In this embodiment, measuring the first and second discharge times includes pre-charging an electronic circuit coupled to the memory cell, activating the memory cell so as to discharge the electronic circuit, at least partially through the memory cell, starting the first and second time measurement when the memory cell is activated, stopping the first time measurement when the voltage level in the electronic circuit falls below a first pre-defined reference voltage and stopping the second time measurement when the voltage level in the electronic circuit falls below a second pre-defined reference voltage that is less than the first pre-defined reference voltage.

Another embodiment of the present invention is directed to a method for reading a memory cell in which a variation of the characteristic parameter of the memory cell affects the effective resistance of the memory cell. The method of this embodiment includes: charging a bit line coupled to the memory cell to predetermined starting voltage; starting a first time measurement at a first time; starting a second time measurement at the first time; stopping the first time measurement when a voltage on the bit line has fallen to a first reference voltage; determining that the first time measurement is greater than a minimum discharge time; and determining the value stored in the memory cell based on the first measurement time.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
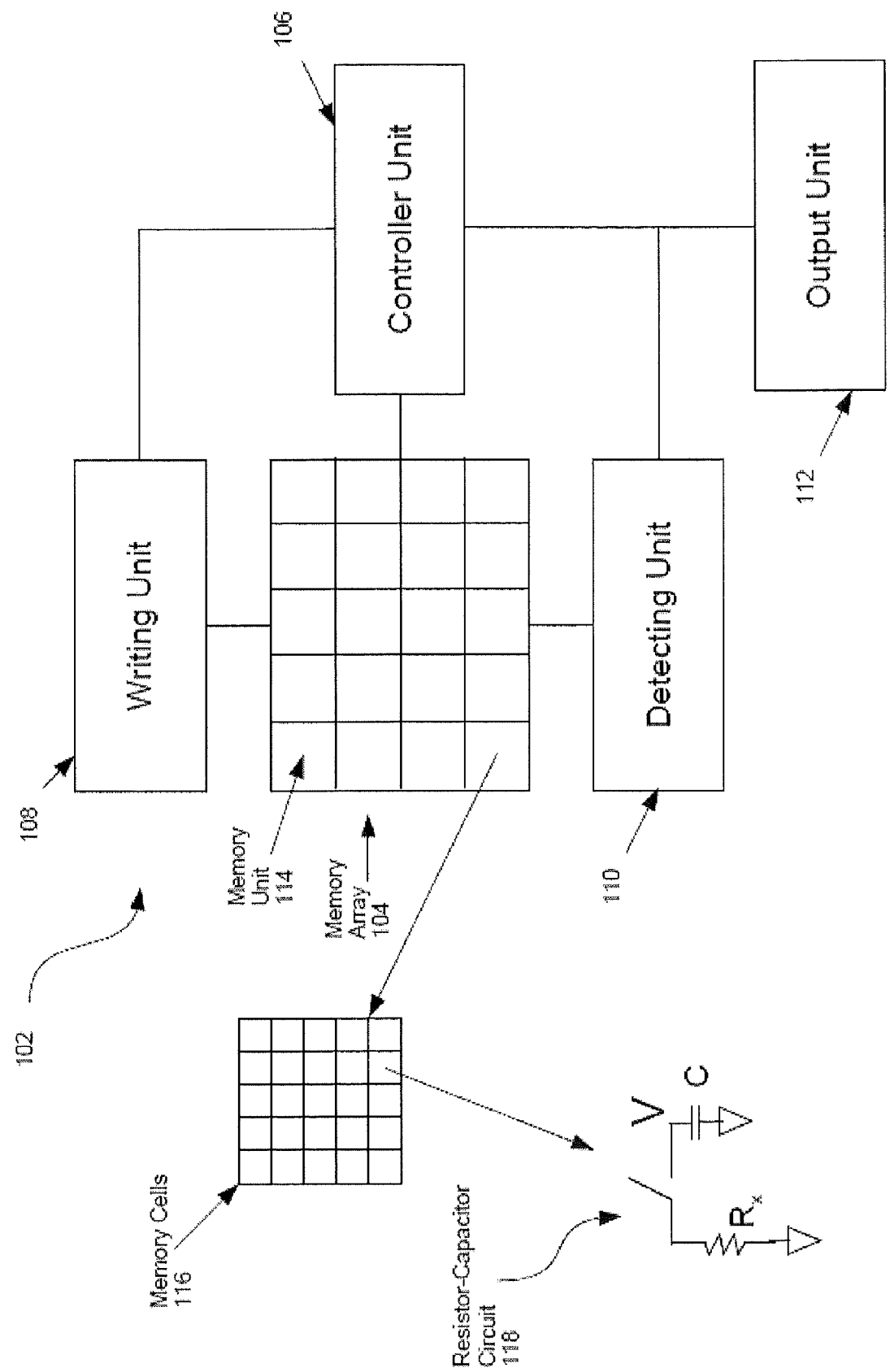
FIG. 1 illustrates a particular embodiment of a memory array in accordance with the present invention.

The detailed description explains the preferred embodiments of the invention, together with advantages and features, by way of example with reference to the drawings.

DETAILED DESCRIPTION OF THE INVENTION

Aspects of the present invention will be described with reference to FIG. 1-6. When referring to the figures, like elements shown throughout are indicated with like reference numerals.

FIG. 1 illustrates a memory system 102 according to one embodiment of the present invention. The memory system 102 includes a memory array 104, a controller unit 106, a writing unit 108, a detecting unit 110, and an output unit 112.

The memory array 104 contains a plurality of memory cells 116, with each memory cell 116 forming, at least partially, an electronic circuit 118. In a particular embodiment of the invention, the electronic circuit 118 is a resistor-capacitor circuit. The memory cells 116 may be packaged as individual memory cells 116 in the memory array 104 or they may be packaged as memory units 114 comprised of a plurality of memory cells 116. Furthermore, the controller unit 106, the writing unit 108, the detecting unit 110, and the output unit 112 may be separately packed or incorporated with the memory array 104.

The memory cells 116 are not limited to a particular memory storage technology. Those skilled in the art will recognize that different memory technologies use different characteristic parameters to represent data. For example Phase Change Memory (PCM) and Resistive Random Access Memory (RRAM) technology use resistance variation as a characteristic parameter to represent binary data. Further examples of characteristic parameters contemplated by the present invention include the number of electrons in the floating gate of a MOSFET, which is measured as a shift in the MOSFET's threshold voltage (Flash memory), and the induced magnetization of a ferromagnetic layer, which is measured as electrical resistance of the memory cell (MRAM). In all these cases and other similar embodiments, it is possible to associate the characteristic parameter of the memory cell with an effective resistance of the memory cell, the effective resistance defined as the ratio of a properly chosen voltage to the current that flows through the memory cell when that voltage is applied across it.

Each memory cell 116 in the memory array 104 is configured to represent at least two binary values. Each binary value is assigned a target discharge time. The target discharge time is the approximate time it takes for the voltage in the electronic circuit 118 to drop to a predetermined level. In a particular embodiment of the invention, the electronic circuit 118 is a resistor-capacitor circuit. The effective resistance of the memory cell forms the resistor and the intrinsic capacitance of the metal line (or bit line) accessing the memory cell forms the capacitor for the said resistor-capacitor circuit. For example, the characteristic parameter stored in PCM memory cells 116 is the crystalline/amorphous phase of the phase change material. The amorphous phase of the memory cell 116 creates a relatively high resistance in the electronic circuit 118 which causes a longer electron discharge time. The crystalline phase of a PCM memory cell 116 has a relatively low resistance in the electronic circuit 118 which results in a shorter electron discharge time. The different lengths of the electron discharge times can be measured and a target can be made for the electron discharge times in the electronic circuit 118. These different target discharge times are then assigned to each of the possible binary value represented in the memory cells 116.

In one embodiment of the present invention, the controller unit 106 forms the electronic circuit 118 with a target memory cell 116. Additionally, the controller unit 106 also assigns the different target discharge times to each of the possible binary values represented in the memory cells 116 of the memory array 104.

The characteristic parameter storage in memory cells 116 is performed by the controller unit 106 and the writing unit 108. A specific binary value is requested by, for example, a Central Processing Unit (CPU) of a computer, to be represented by the target memory cell 116. The writing unit 106 then writes the characteristic parameter in the target cell. In one embodiment, this is done by determining the target discharge time and recursively writing the characteristic parameter in the target memory cell 116 by a pre-defined algorithm and measuring the electron discharge time until the electron discharge time is substantially equal to the target discharge time.

In a particular embodiment of the invention, a request is made by the CPU to retrieve the binary value represented by the target memory cell 116. The controller unit 106 forms an electronic circuit 118 with the target memory cell 116. The electronic circuit 118 is charged to a pre-charge voltage and then discharged. At the beginning of the discharge, the detecting unit 110 begins a time measurement. Once the voltage falls to a predetermined level the detecting unit 110 ends the time measurement.

The output unit 112 compares the electron discharge time to the target discharge times and outputs the binary value associated with the target discharge time closest to the electron discharge time measured by the detecting unit 110. In one embodiment of the present invention, the output unit 112 utilizes statistical methods, such as maximum likelihood estimators, in determining the target discharge time closest to the measured electron discharge time.

Figure 2:
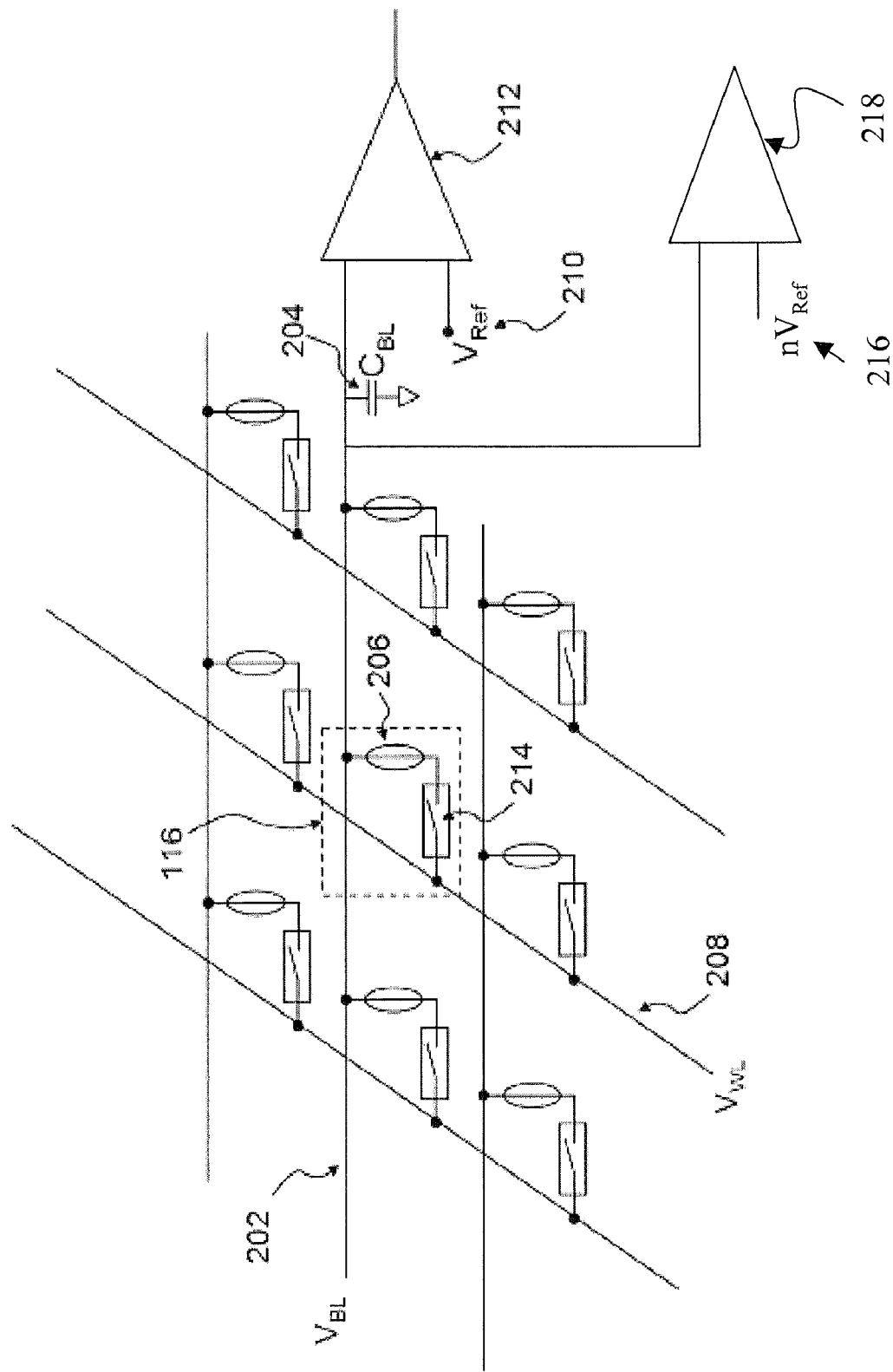
FIG. 2 illustrates a particular embodiment of an electronic circuit for reading the value stored in a memory cell.

Turning to FIG. 2, the electronic circuit 118 of the memory array is shown in more detail. The electronic circuit 118 for the selected memory cell 116 is comprised of a bit-line 202, a bit-line capacitor 204, a resistor 206, a word-line 208, a reference voltage source 210, a first comparator 212 and an access device 214. The access device can be a MOSFET, a PN junction diode, or a bipolar junction transistor. The intrinsic capacitance of the bit-line 202 is represented by the bit-line capacitor 204. The bit-line capacitor 204 is connected to the word-line 208 through the effective resistance of the memory cell modeled by the resistor 206 and the access device 214. The first comparator 212 is connected to the reference voltage source 210 which is set to the first predetermined voltage level 210. When the bit-line voltage and reference voltage are equal, the comparator 212 signals to stop the timer measuring the discharge time.

The resistor 206 and capacitor 204 include, respectively, the inherent resistance and inherent capacitance in the memory cell. In a particular embodiment of the invention, the resistance value of the memory cell depends on the characteristic parameter value. For example, as stated above for the PCM memory cells, the characteristic parameter is the crystalline/amorphous state of the phase change material. A highly amorphous state of the phase change material creates a higher resistance and a highly crystalline state of the phase change material results in a lower resistance. Also stated above, the resistor 206 is not limited to one particular type of characteristic parameter.

In one embodiment of the invention, the memory cell is read by first pre-charging the bit-line capacitor 204 to a predetermined voltage level. The electron discharge time measurement begins when the word-line 208 is turned on which causes the charge stored in the bit-line capacitor 204 to discharge through the resistor 206 and the access device 214. Using the PCM example again, the higher resistance of amorphous phase change material will result in a longer electron discharge time than the lower resistance of crystalline phase change material. The first comparator 212 receives the bit-line voltage from the bit-line 202 and the first reference voltage 210. When the bit-line voltage drops to the first reference voltage 210, the time measurement related to the first comparator 212 ends.

In another embodiment of the invention, where the memory element is a floating gate MOSFET, the charge stored in the gate oxide is the characteristic parameter. The effective resistance of the memory element is the ratio of the voltage applied between the drain and source terminals of the MOSFET to the current flowing in response to that applied voltage through the transistor. As described herein, the binary value represented by the memory cell is determined by measuring the discharge time through the effective R-C circuit.

It has been realized herein that certain instances may exist where it is difficult to discern between different resistive values stored in the cell because the decay times for some resistive values are very close to one another. That is, the different resistive values may fall from a predetermined level to a reference value in times that are very close to one another. In such a case, it may not be possible to resolve between two values based on when the bit-line voltage falls to the first reference voltage. This point is further illustrated with reference to FIG. 3.

Figure 3:
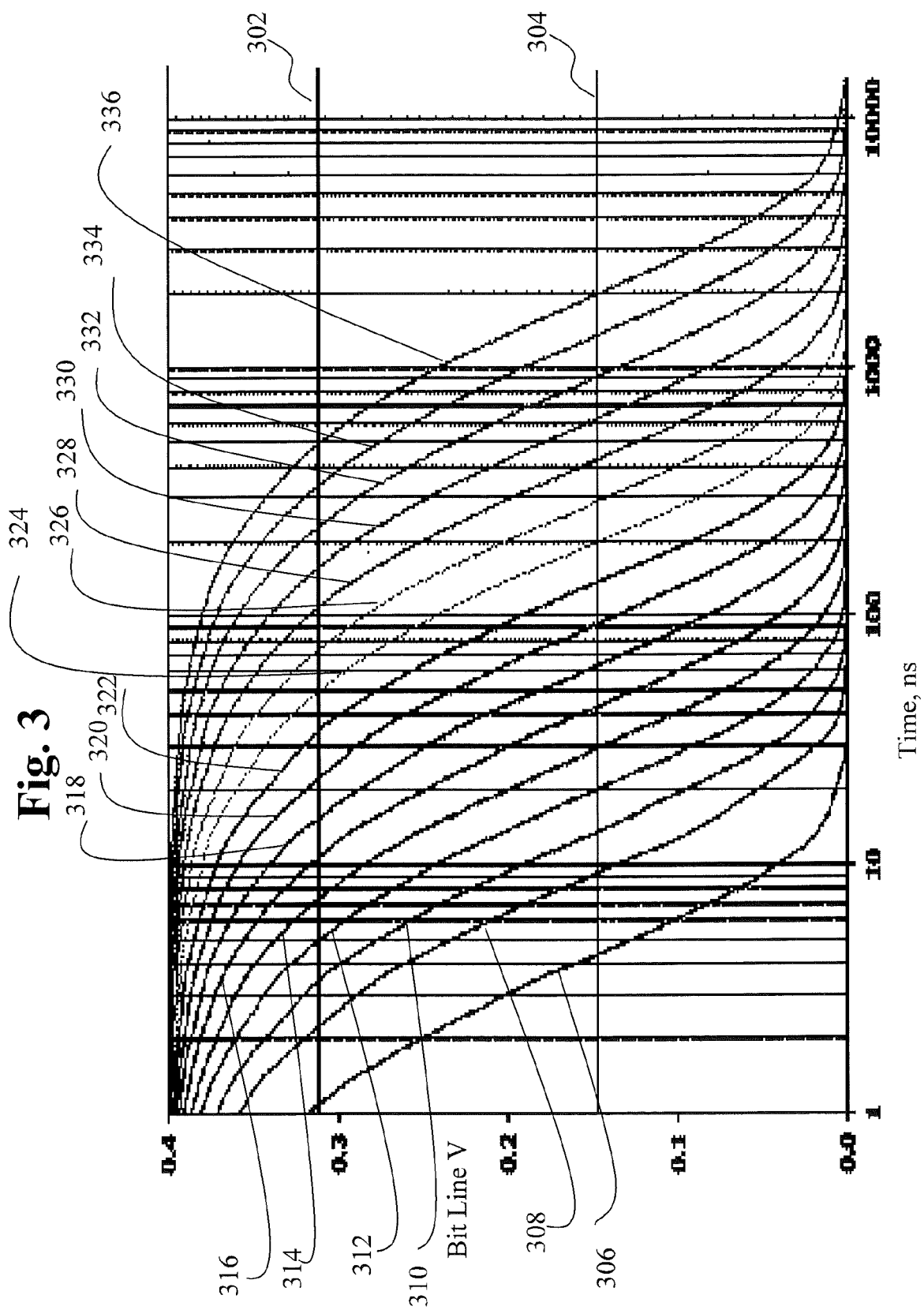
FIG. 3 illustrates decay curves for various values that may be stored in a memory cell.

FIG. 3 illustrates a voltage drop chart for the bit-line voltage. The chart illustrates the electron discharge time in the bit-line for several bit line resistance levels. The graph of FIG. 3 includes a first curve 306 that represents the discharge time vs. voltage $V_{bl}$ for a binary 0000 stored in a memory cell. The graph of FIG. 3 also includes a second curve 308 that represents the discharge time vs. voltage $V_{bl}$ for a binary 0001 stored in a memory cell. In a similar manner, the graph of FIG. 3 also includes a third curve 310, a fourth curve 312, a fifth curve 314, a sixth curve 316, a seventh curve 318, an eighth curve 320, a ninth curve 322, an tenth curve 324, an eleventh curve 326, a twelfth curve 328, a thirteenth curve 330, a fourteen curve 332, a fifteenth curve 334 and a sixteenth curve 336 which correspond, respectively, to the binary values 0010 to 1111. These values may be stored, for example, in a memory cell capable of storing 16 distinct states.

In particular, the bit line voltage is shown on the y-axis and time in nanoseconds is shown on the x-axis. Of course, the chart shown in FIG. 3 is for illustrative purposes only and in no way limits the scope of the present invention.

The voltage level with respect to time can be calculated by the formula, $$V(t)=V(0)\cdot\exp[-t/(R_xC)], x=1,\ldots,n.$$

Here, V(t) is the voltage level 306 at time t, V(0) is the pre-charge voltage, R is the resistance level of the memory cell dependent on the characteristic parameter stored in the memory cell, C is the capacitance of the circuit, and n is the number of characteristic parameter levels possibly stored in the memory cell.

A first predetermined voltage level is set in the circuit as a fraction of the pre-charge voltage. In this arbitrary example, the predetermined voltage level V(0) is set at 0.4V. Also shown is the first reference voltage 302 and a second reference voltage 304. The first reference voltage 302 is set at 0.32V in this example. In one embodiment, the second reference voltage 304 may equal y times the first predetermined voltage level where 0<y<1. As shown, y is roughly 0.5 and thus, the second predetermined voltage level is about 0.16V.

As shown, the curve for memory cells set to the first resistance level 306 takes about 1.2 nanoseconds for the voltage to drop to the first reference voltage level 306 and the curve for memory cells set to the second resistance level 308 takes about 2.2 nanoseconds to drop to the first reference voltage 302. The difference between these times is thus, only about 1 nanosecond. This difference may not be resolvable with sufficient certainty of the stored value. That is, the curves may be too close together to definitively conclude what value was stored in the memory cell. However, if the curves are allowed to decay further, it can be seen that the curves spread apart from one another. For example, as shown in FIG. 3, the curve for memory cells set to the first resistance level 306 takes about 4.5 nanoseconds to fall to the second resistance level 304 while memory cells set to the second resistance level 308 takes about 9.5 nanoseconds the second reference voltage 304. The difference in time between curves is, thus, expanded such the decay time is more than doubled. Such separation may help improve certainty in resolving the value stored in the memory cell. Of course, and as shown, for example, by the difference between the fifteenth curve 334 and the sixteenth curve 336, for some values the decay time difference may be large enough to utilize only the decay times to the first reference voltage 302.

In one embodiment of the present invention, in the event that the measured decay time to reach the first reference voltage is less than a particular threshold value, it may be determined that the time when the voltage falls to a second, lower reference voltage should be utilized to determine the value stored in a memory cell. Of course, in some instances, the decay time may be sufficient to resolve values based solely on the decay time to the first reference voltage. In such instances, the decay to the first reference voltage may be used and the second time ignored. This may be beneficial when the second time is appreciably longer and may delay the operation of other portions of the circuit. In short, a first, fast time may be used if it is long enough and a second, slower time may be used in all other cases.

To that end, and referring now back to FIG. 2, the electronic circuit 118 may also include second comparator 218 coupled to bit-line voltage from the bit-line 202 and the second reference voltage 216. When the bit-line voltage drops to the second reference voltage 216, the second time measurement ends. It shall be understood that the time measurement begins at the same time for both comparator 212 and comparator 214.

Figure 4:
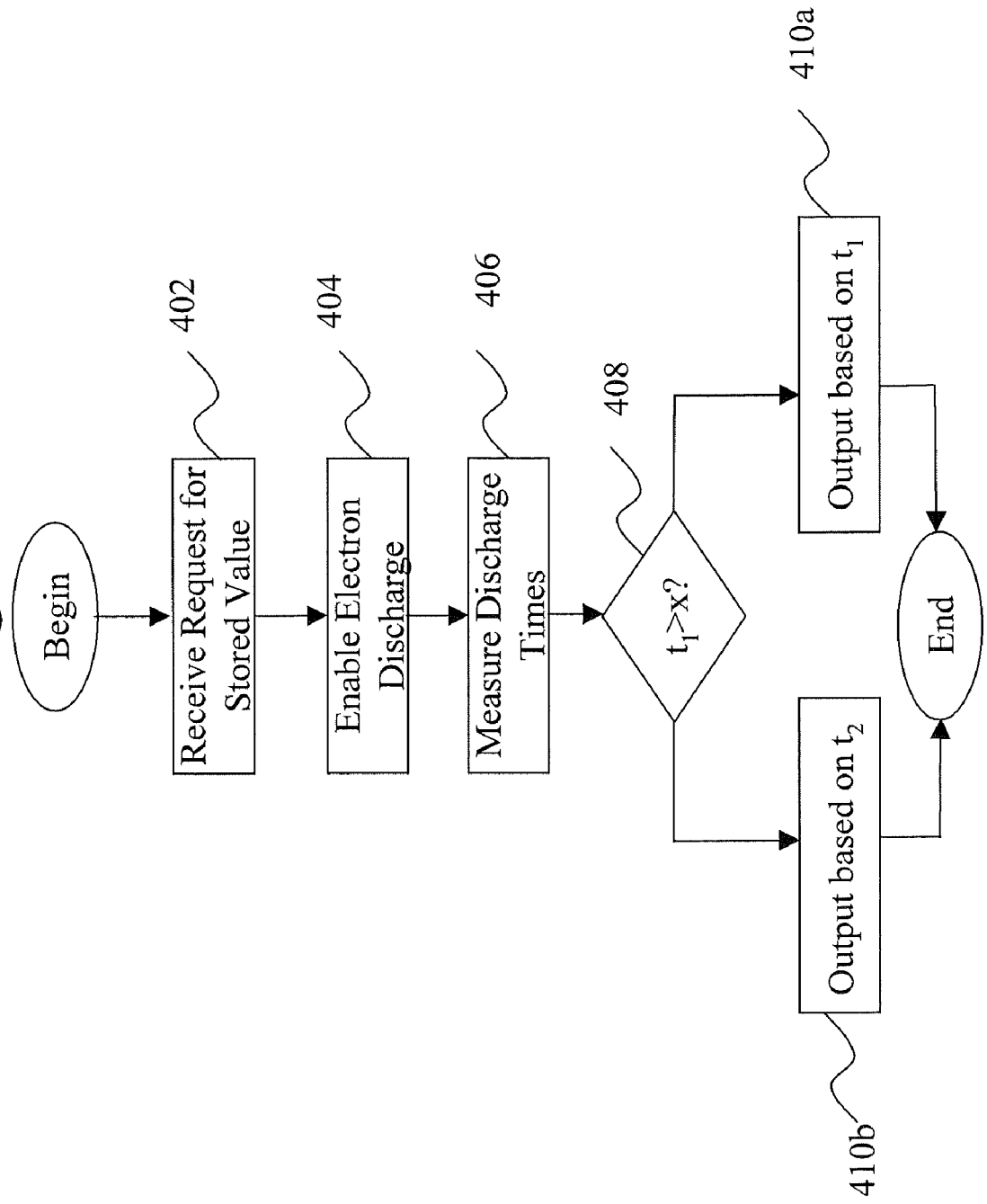
FIG. 4 illustrates operational flow for a read operation according to an embodiment of the present invention.

FIG. 4 illustrates a reading operation according to one embodiment of the present invention. At a block 404, a request for the stored binary value in a memory cell is received. The target memory cell is located and the electronic circuit is formed with the memory cell. After the electronic circuit is formed, the control passes to block 404 where an enabling operation may be performed. In particular, at block 404 the system enables an electron discharge. In one embodiment of the invention, the system pre-charges the bit-line in the electronic circuit and turns on the word-line in the circuit, thereby causing the capacitor to discharge. It is contemplated that other electronic circuits equivalent to resistor-capacitor circuits may utilize the present invention. When the electron discharge begins, the control passes to block 406 where a measuring operation is performed.

At block 406 the electron discharge time is measured. In one embodiment of the invention, the electron discharge time measurement begins when the word-line is turned on. The electron discharge time measurement ends when the bit-line voltage falls to the predetermined voltage level. In one embodiment of the present invention, two times are measured. For example, a first time ($t_1$) indicates when the bit-line voltage falls to a first voltage level and the second time ($t_2$) indicates when the bit-line voltage falls to a lower, second voltage level. Both the first and second times may begin at the same time.

At a block 408 it is determined if $t_1$ is greater than a minimum time (or number of clock pulses). If it is, control passes to block 410a. It shall be understood that if $t_1$ is greater than the minimum time (sometimes referred to as "x" herein) the distance between the curves shown in FIG. 3 may be sufficient to differentiate between the resistance states with a requisite certainty. In one embodiment, the value of x may be about 8 ns (or 40 clock pulses of a 0.2 ns clock). Of course, any value for x may be used. In the event that $t_1$ is less than x, then the curves may be too close to one another as described above. In such a case, the method awaits the second voltage crossing and, after that happens, $t_2$ is utilized to determine the resistance level of the cell at block 410b.

At the output blocks 410a and 410b, the target discharge time closest to the measured electron discharge time is determined and the associated binary value is outputted to the CPU. In the event t is to be used, at block 410a the estimated times based on when the curves' decay to the first reference voltage 302 (FIG. 3) are used. At block 410b the estimated times based on when the curves decay to the second reference voltage 304 (FIG. 3) are used. Regardless, the electron discharge time, as mentioned above, need not exactly equal the closest target discharge time in the selected distribution. For example, utilizing statistical operations known to those skilled in the art, the correct target discharge time can be determined by the measured electron discharge time. When the binary value has been outputted by either block 410a or 410b, the reading operations end.

Figure 5:
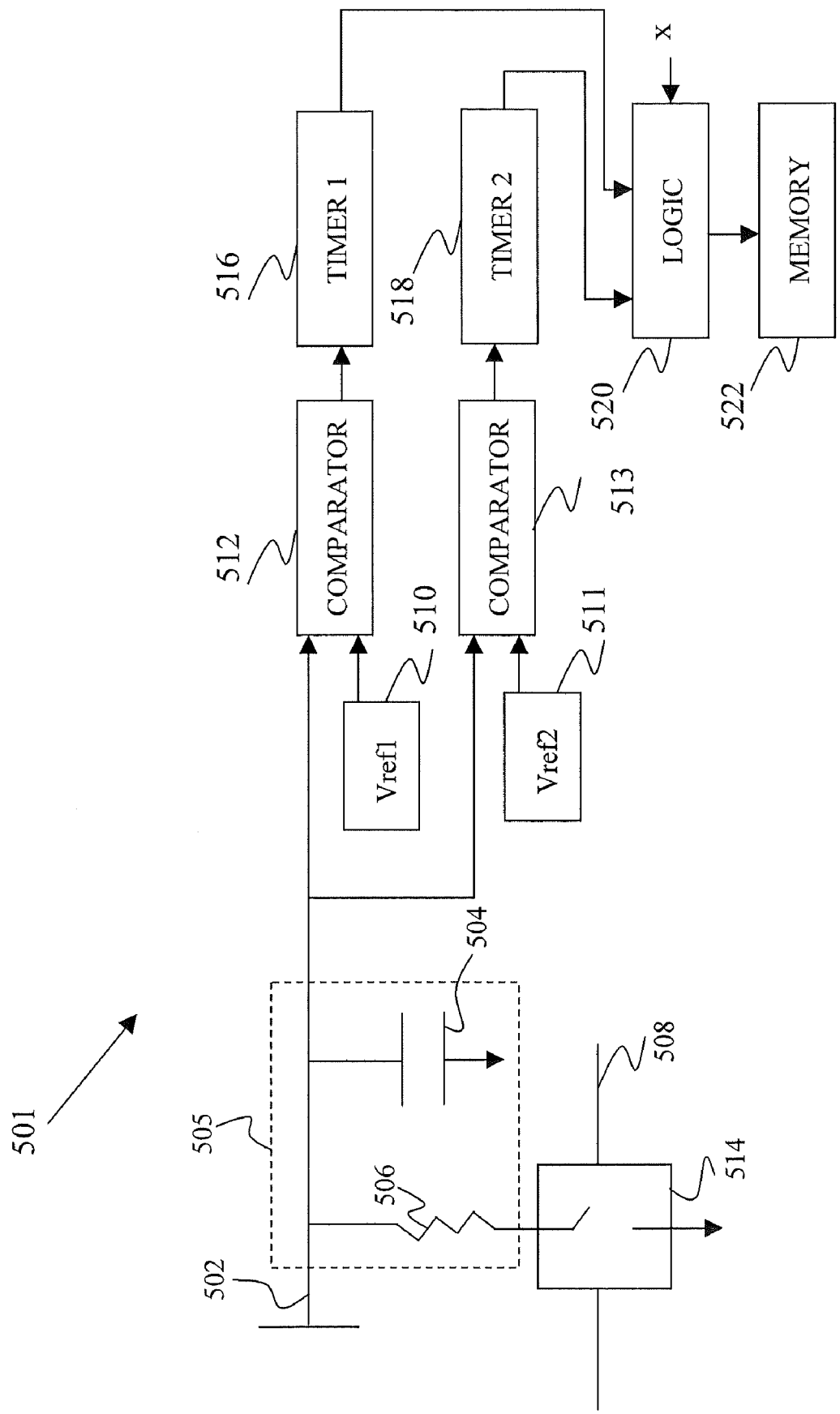
FIG. 5 illustrates a circuit for reading a memory cell according to one embodiment of the present invention.

FIG. 5 shows a circuit 501 according to one embodiment of the present invention. The circuit 501 includes the selected memory cell 505 (shown as a resistor and a capacitor) that is coupled to a bit-line 502 and to a word line 508 and includes a bit-line capacitor 504, a resistor 506, and an access device 514. The access device 514 can be a MOSFET, a PN junction diode, or a bipolar junction transistor. The intrinsic capacitance of the bit-line 502 is represented by the bit-line capacitor 504. In the case of the access device being a PN junction diode, the bit-line capacitor 504 is connected to the word-line 508 (and in the cases of the access devices being a MOSFET or a bipolar junction transistor is connected to ground) through the effective resistance of the memory cell 505, modeled by the resistor 506, and the access device 514.

The circuit 500 may also include a first comparator 512 and a second comparator 513 both of which are coupled to the bit line 502. The comparators 512 and 513 are coupled, respectively, to a first reference voltage 511 and a second, lower reference voltage 511. In operation, the memory cell is read by first pre-charging the bit-line capacitor 504 to a predetermined voltage level. The electron discharge time measurement begins when the word-line 508 is turned on which causes the charge stored in the bit-line capacitor 504 to discharge through the resistor 506 and the access device 514. Both the first and second timers 516 and 518 are started when the word-line 508 is turned on. In one embodiment, the first and second timers 516 and 518 may measure time or may measure clock counts. Of course, the first and second timers 516 and 518 could be implemented as parts of a single clock.

Using the PCM example again, the higher resistance of amorphous phase change material will result in a longer electron discharge time than the lower resistance of crystalline phase change material. When the bit-line voltage and first reference voltage 510 are equal, the comparator 512 signals to stop the first timer 516 measuring the first discharge time $t_1$. When the bit-line voltage and second reference voltage 511 are equal, the comparator 512 signals to stop the second timer 518 measuring the second discharge time $t_1$.

The time ($t_1$) is then compared to a preset time by logic (either hardware or software) contained in logic block 520. It is assumed that $t_1$ is less than $t_2$. In the event that $t_1$ is greater than present minimum time (x), $t_1$ is stored in memory 522 and used to estimate the resistance, and, therefore, the logic value of, of the memory cell 502. In the event that $t_1$ is less than x, the logic 520 waits for $t_2$ (if it is not yet present) and stores it in memory 522. The logic 520 may also provide an indication of whether the first or second discharge time has been stored.

As described above, the utilizing the second discharge time may increase the resolution between different binary values that may be stored in a multi-level cell. Of course, as speed may be of the essence, the present invention allow the first discharge time to be used when that time is large enough to provide sufficient resolution without the further delay of waiting for the second discharge time.

Those of skilled in art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present invention.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, conventional processor, controller, microcontroller, state machine, etc. A processor can also be implemented as a combination of computing devices, e.g., a combination of a DSP and a microprocessor, a plurality of microprocessors, one or more microprocessors in conjunction with a DSP core, or any other such configuration. In addition, the term "processing" is a broad term meant to encompass several meanings including, for example, implementing program code, executing instructions, manipulating signals, filtering, performing arithmetic operations, and the like.

The steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, a DVD, or any other form of storage medium known in the art. A storage medium is coupled to the processor such that the processor can read information from, and write information to, the storage medium. In the alternative, the storage medium may be integral to the processor. The processor and the storage medium can reside in an ASIC. The ASIC can reside in a user terminal. In the alternative, the processor and the storage medium can reside as discrete components in a user terminal.

The modules can include, but are not limited to, any of the following: software or hardware components such as software object-oriented software components, class components and task components, processes, methods, functions, attributes, procedures, subroutines, segments of program code, drivers, firmware, microcode, circuitry, data, databases, data structures, tables, arrays, or variables.

Having described preferred embodiments for multi-level memory cell utilizing measurement discharge time as the characteristic parameter for level definition (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A memory system comprising:
    a memory cell configured to represent at least two binary values;
    a bit line coupled to the memory cell;
    a first comparator coupled to the bit line that compares a first reference value to a value of a parameter of the bit-line;
    a second comparator coupled to the bit line that compares a second reference value to the value of a parameter of the bit-line;
    a first timer coupled to the first comparator that measures a time for the parameter of the bit line to decay from a first value to the first reference value;
    a second timer coupled to the second comparator that measures a time for the parameter of the bit line to decay from the first value to the second reference value; and
    a logic unit coupled to the first timer and the second timer that selects the time for the parameter of the bit line to decay from the first value to the first reference value in the event it is greater than a minimum time and otherwise selects the time for the parameter of the bit line to decay from the first value to the second reference value.

2. The system of claim 1, further comprising:
    a memory for storing the selected time.

3. The system of claim 1, wherein the parameter is a voltage.

4. The system of claim 1, wherein the first reference value is greater than the second reference value.

5. The system of claim 1, wherein the memory cell is a phase change memory cell.

6. The system of claim 1, further comprising:
    an access device coupled to the memory cell;
    a word line coupled to the access device.

7. The system of claim 6, wherein the first timer and the second timer begin timing when the word line is activated.

8. The system of claim 7, wherein the first timer stops timing when the parameter of the bit line equals the first reference value and wherein the second timer stops timing when the parameter of the bit line equals the second reference value in the event that the time for the parameter of the bit line to decay from the first value to the first reference value is not selected by the logic circuit.

9. The system of claim 1, wherein the logic unit is implemented in hardware.

10. The system of claim 1, wherein the first timer and the second timer are formed by the same circuit.

11. The system of claim 1, wherein the first timer and the second timer measure clock pulses.

12. A method for reading a memory cell in which a variation of the characteristic parameter of the memory cell affects the effective resistance of the memory cell, the method comprising:
    measuring a first discharge time of a reference voltage through the memory cell;
    measuring a second discharge time of the reference voltage through the memory cell, wherein the first discharge time is measured during at least a portion of the time the second discharge time is being measured;
    determining that the first discharge time is less than a minimum discharge time; and
    determining the value stored in the memory cell based on the second discharge time;
    wherein measuring the first and second discharge times includes pre-charging an electronic circuit coupled to the memory cell, activating the memory cell so as to discharge the electronic circuit, at least partially through the memory cell, starting the first and second time measurement when the memory cell is activated, stopping the first time measurement when the voltage level in the electronic circuit falls below a first pre-defined reference voltage and stopping the second time measurement when the voltage level in the electronic circuit falls below a second pre-defined reference voltage that is less than the first pre-defined reference voltage.

13. The method of claim 12, wherein the memory cell is phase change memory cell.

14. The method of claim 12, wherein measuring the first discharge time is measured by a first timer and measuring the second discharge time is measured by a second timer and wherein the first timer and second timer are started at a same time.

15. The method of claim 14, wherein measuring the first discharge time is completed before measuring the second discharge time is completed.

16. A method for reading a memory cell in which a variation of the characteristic parameter of the memory cell affects the effective resistance of the memory cell, the method comprising:
    charging a bit line coupled to the memory cell to a predetermined starting voltage;
    starting a first time measurement at a first time;
    stopping the first time measurement when a voltage on the bit line has fallen to a first reference voltage;
    determining that the first time measurement is greater than a minimum discharge time; and
    determining the value stored in the memory cell based on the first measurement time.

17. The method of claim 16, further including:
    pre-charging an electronic circuit coupled to the memory cell; and activating the memory cell so as to discharge the electronic circuit, at least partially through the memory cell, wherein the first time occurs when the memory cell is activated.

18. The method of claim 16, wherein the memory cell is phase change memory cell.

19. The method of claim 16, wherein the first time measurement represented as a number of clock pulses.

20. The method of claim 16, wherein the minimum discharge time is equivalent to 10 clock pulses.

* * * * *